(12) United States Patent
Tihanyi

(10) Patent No.: US 6,362,505 B1
(45) Date of Patent: Mar. 26, 2002

(54) MOS FIELD-EFFECT TRANSISTOR WITH AUXILIARY ELECTRODE

(75) Inventor: Jenoe Tihanyi, Kircheim (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/627,319

(22) Filed: Jul. 27, 2000

(51) Int. Cl.[7] .......................... H01L 29/76; H01L 29/94; H01L 31/062; H01L 31/13; H01L 31/119
(52) U.S. Cl. .................. 257/329; 257/341; 257/342
(58) Field of Search ........................... 430/212, 268; 257/328, 329, 331, 341, 342, 335, 336

(56) References Cited

U.S. PATENT DOCUMENTS 5,900,662 A * 5/1999 Frisina et al. .............. 257/341
6,184,555 B1 * 2/2001 Tihanyi et al. ............. 257/342

FOREIGN PATENT DOCUMENTS

| DE | 4309764 A1 | 9/1994 |
| DE | 19534154 A1 | 3/1997 |
| DE | 19604043 A1 | 8/1997 |
| EP | 0915521 A2 | 5/1999 |

OTHER PUBLICATIONS

International Search Report for PCT/DE99/03542.

* cited by examiner

*Primary Examiner*—Olik Chaudhuri
*Assistant Examiner*—Hoai Pham
(74) *Attorney, Agent, or Firm*—Morrison & Foerster, LLP

(57) ABSTRACT

A MOS field-effect transistor is disclosed having a low on resistance $R_{on}$, in which auxiliary electrodes composed of polycrystalline silicon surrounded by an insulating layer are provided in the drift path between semiconductor regions of one conduction type. A MOSFET according to the invention may be fabricated in a simple manner compared to conventional MOSFETs using, for example, trench processing technology.

14 Claims, 2 Drawing Sheets

MOS FIELD-EFFECT TRANSISTOR WITH AUXILIARY ELECTRODE

This application is based on PCT application PCT/DE99/03542, which claims priority to German application 19854915.6. Both applications are hereby incorporated in their entirety by reference.

TECHNICAL FIELD OF THE INVENTION

The present invention relates to a MOS field-effect transistor (MOSFET), and more particularly to a MOSFET with a low on resistance $R_{on}$ which may be fabricated using simple fabrication techniques such as trench processing.

BACKGROUND OF TEE INVENTION

As is known, a search has been underway for some time now for ways to reduce the on resistance $R_{on}$ of MOSFETs, especially that of power MOSFETs. U.S. Pat. No. 5,216,275, for example, describes a power semiconductor device which is basically constructed in the manner described in the introduction thereof the drift path of this semiconductor device is provided with a so-called "voltage sustaining layer", which comprises vertical p- and n-type semiconducting regions which lie next to one another and alternate with one another and between which an insulating layer made of silicon dioxide is provided. FIG. 4 shows a MOSFET which is exemplary of a prior art semiconductor device of this type. Similar Device with oxdye between n and p layers is described in U.S. Pat. No. 4,754,310/Coe.

This known MOSFET comprises a semiconductor body 1 having an n⁺-doped drain contact zone 2; mutually alternating n-type and p-type semiconductor zones 3 and 4, respectively, 7 which are isolated from one another by an insulating layer 5 made of for example, silicon dioxide and p-type semiconductor zones ("body" zones) 6 and n-type semiconductor zones 7 embedded in the zones 6.

Silicon is usually used for the semiconductor body 1, although other materials may also optionally be used. The conductivity types specified may also optionally be reversed.

Gate electrodes 9 made of doped polycrystalline silicon are embedded in an insulating layer 8 made, for example, of silicon dioxide or silicon nitride and are provided with a terminal G. A metal layer 10 made of aluminum, for example, makes contact with the n-type zones 7 and is is provided with a source terminal S, which may be grounded. A drain voltage $^+U_D$ is applied to the n⁺-doped semiconductor layer 2, which is provided with a drain terminal D.

With the applied voltage $^+U_D$, the zones 3 and 4 are mutually depleted of charge carriers. If, in the zones 3 and 4, which run in the form of pillars between the two main surfaces A and B, respectively, of the semiconductor body 1, the total quantity of the n-type doping and of the p-type doping is about the same or so low that the zones 3 and 4 are completely depleted of charge carriers before a breakdown occurs, then such a MOSFET can block high voltages and nevertheless have a low on resistance $R_{on}$. On account of the insulating layer 5 between the n-type zones 3 and the p-type zones 4, the p-type zones 4 arranged underneath the zones 6 in this case serve as grounded field plates for the n-type zones 3 as long as the latter are not completely depleted of charge carriers.

SUMMARY OF THE INVENTION

It is an object of the present invention, therefore, to provide a MOSFET which has a low $R_{on}$ comparable to prior art MOSFETs but is considerably simpler to produce.

A MOSFET according to the present invention comprises:

a semiconductor body of a first conductivity type having a first and a second main surface, at least one first semiconductor zone of a second conductivity type opposite to the first conductivity type embedded in the semiconductor body at the first main surface;

at least one second semiconductor zone of the first conductivity type provided in the at least one first semiconductor zone;

at least one gate electrode in a region above the at least one first semiconductor zone between the at least one second semiconductor zone and the semiconductor body; and a first electrode in contact with the semiconductor body on the second main surface and a second electrode in contact with the at least one second semiconductor zone, wherein at least one auxiliary electrode provided with an insulating layer is provided in the semiconductor body, the at least one auxiliary electrode extending in a direction between the first and the second main surfaces of the semiconductor body and being electrically connected to the at least one first semiconductor zone.

In the case of the conventional, prior art MOSFET structure such as that described in the introduction, the above mentioned object may be achieved according to the invention by virtue of the fact that at least one auxiliary electrode provided with an insulating layer is provided in the semiconductor body, which auxiliary electrode extends in the direction between the first and the second main surface of the semiconductor body and is electrically connected to the first semiconductor zone. The auxiliary electrode preferably lies directly underneath the first semiconductor zone.

In this case, it is also possible for a plurality of auxiliary electrodes of this type to be provided underneath each first semiconductor zone. These auxiliary electrodes may, if appropriate, be configured "in a pencil-like manner", as shown, for example in FIG. 1. The auxiliary electrodes may extend as far as a highly doped layer of the first conductivity type in a region near the second main surface, that is to say to a point in proximity to a drain contact zone. However, it is also possible for the auxiliary electrodes merely to reach as far as a weakly doped layer of the first conductivity type, which is provided between the semiconductor body and a heavily doped semiconductor layer of the first conductivity type in contact with the first electrode.

The auxiliary electrode itself is preferably composed of highly doped polycrystalline silicon, while silicon dioxide is preferably used for the insulating layer.

The depth of the auxiliary electrodes may, for example, be between about 5 and 40 $\mu$m, while their width may be between about 1 and 5 $\mu$m. The thickness of the insulating layer on the polycrystalline silicon of the auxiliary electrode may be between 0.1 and 1 $\mu$m, where this thickness may increase in the direction of the second main surface or toward the center of the auxiliary electrodes between the two main surfaces.

The MOSFET according to the invention can be produced in a particularly simple manner: trenches are introduced, for example by etching, in the, for example, n-type semiconductor body. The walls and bottoms of said trenches are provided with an insulating layer, which may be produced by oxidation, with the result that, in a semiconductor body composed of silicon, a silicon dioxide layer is formed as an insulating layer. The trenches are then filled with n⁺- or p⁺-doped polycrystalline silicon.

In this case, p$^+$-type doping is preferred for the polycrystalline silicon of the auxiliary electrode because, if a hole should be present in the insulating layer, then a blocking p-n junction is produced after p-type diffusion through the hole in the n-type semiconductor body. In the case of n$^+$ doping for the polycrystalline silicon of the auxiliary electrode, by contrast, a short circuit to the n-type semiconductor body would be caused by such a hole.

The auxiliary electrodes themselves may be formed as pillars, grids or strips or have other configurations.

Moreover, the n-type semiconductor zones may be doped increasingly highly as the separation between the auxiliary electrodes is decreased. However, it should be taken into account in this case that, with auxiliary electrodes running parallel to one another, the lateral surface charge of the n-type semiconductor zones is not to exceed the dopant quantity corresponding to twice the breakdown charge.

The n$^+$-type or p$^+$-type doping in the polycrystalline silicon of the auxiliary electrodes need not be homogeneous. Rather, fluctuations in the doping concentration are readily permissible. Moreover, the depth of the auxiliary electrodes or of the trenches is not critical; these may reach as far as a highly doped drain contact zone, but need not do so.

Instead of a, for example, n-type semiconductor body, layers with different doping may also be provided for said body.

BRIEF DESCRIPTION OF THE DRAWINGS

Embodiments of the invention will now be described by way of example with reference to the drawings in which.

DETAILED DESCRIPTION OF THE INVENTION

Figure 1:
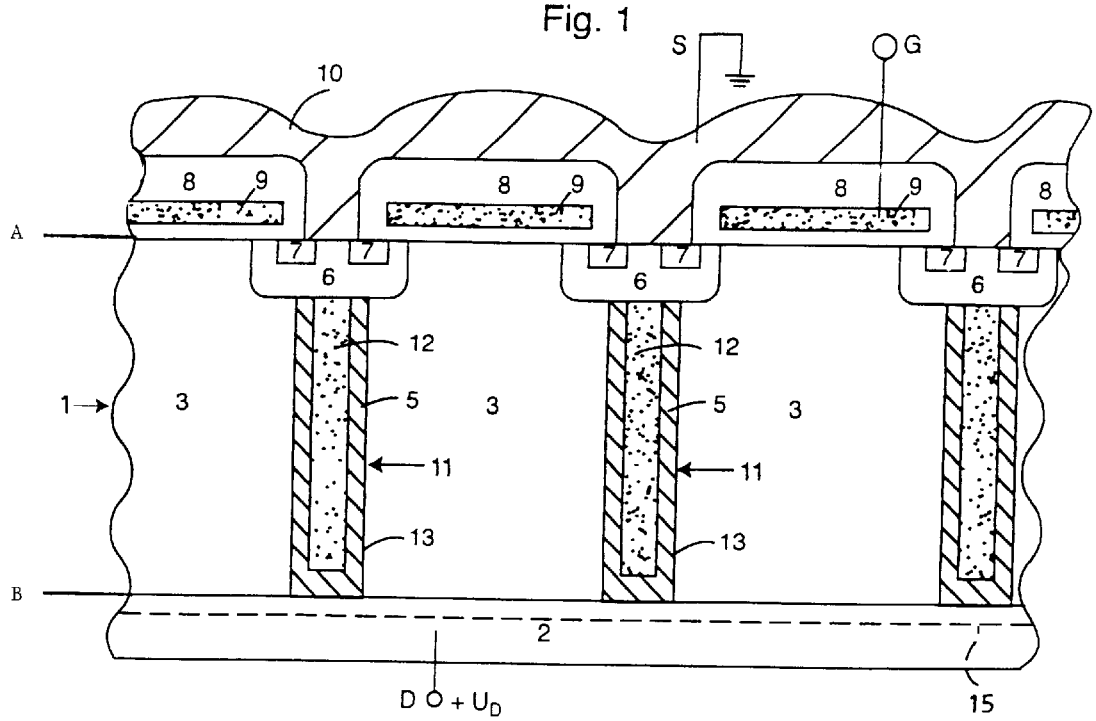
FIG. 1 shows a cross section of a MOSFET according to a first exemplary embodiment of the invention.
Figure 2:
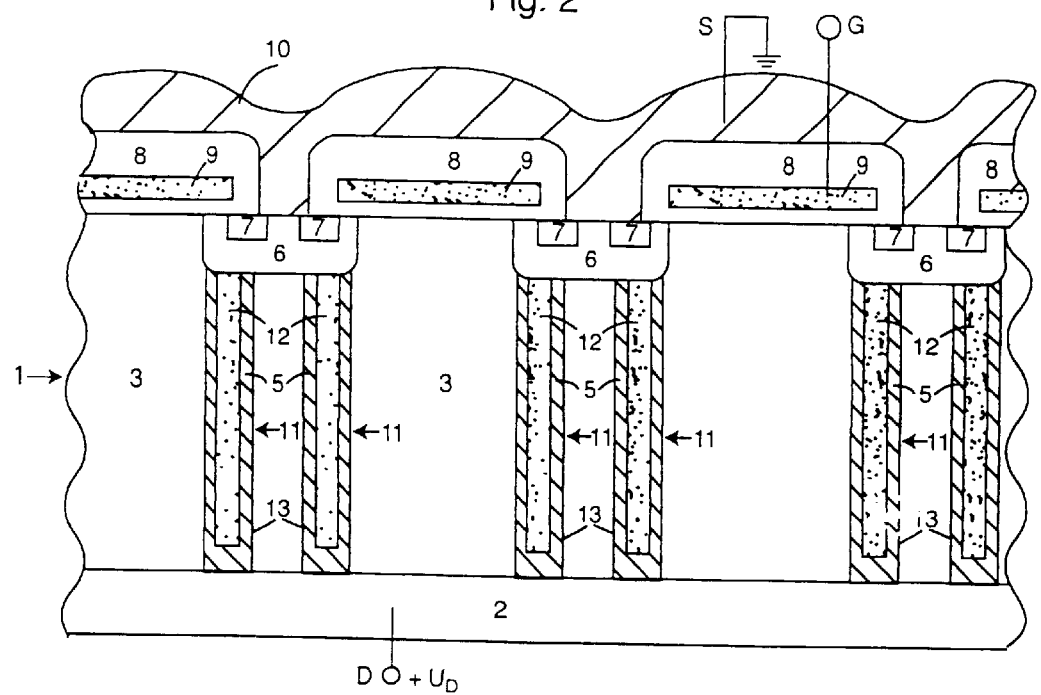
FIG. 2 shows a cross section of a MOSFET according to a second exemplary embodiment of the invention.
Figure 3:
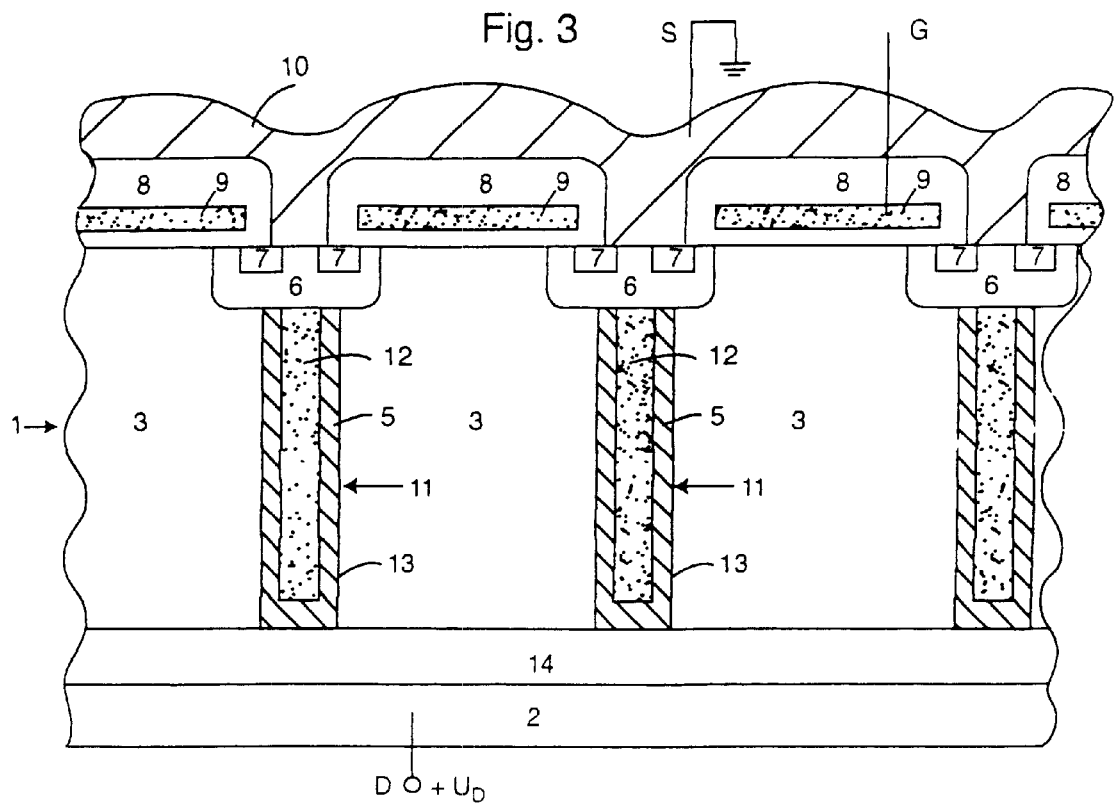
FIG. 3 shows a cross section of a MOSFET according to a third exemplary embodiment of the invention.
Figure 4:
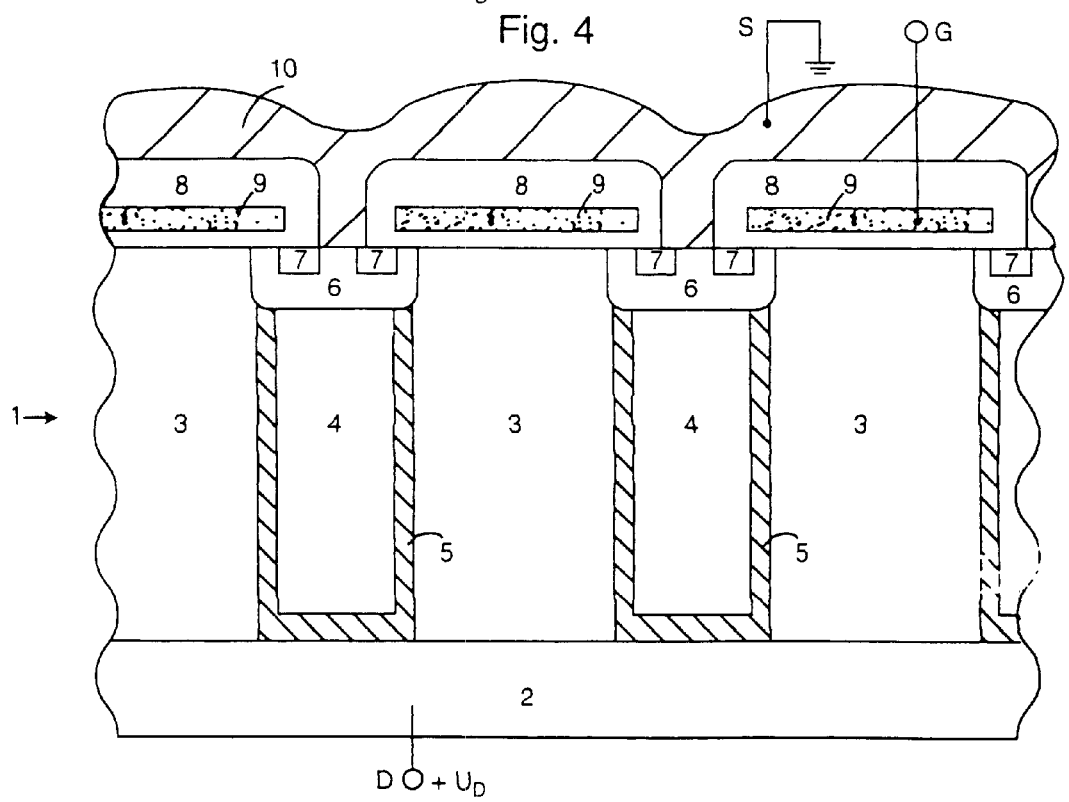
FIG. 4 shows a cross section of a MOSFET according to the prior art.

In FIGS. 1 to 3, the same reference symbols as in FIG. 4 are used for mutually corresponding parts. It is also possible, as in FIG. 4, for the respective conductivity types specified to be reversed.

FIG. 1 shows an exemplary embodiment of a MOSFET according to the invention. In contrast to the conventional MOSFET shown in FIG. 4, p-type zones 4 surrounded by an insulating layer 5 are not provided in this case. Rather, in the MOSFET of the exemplary embodiment of FIG. 1, auxiliary electrodes 11 are provided, which are each composed of n$^+$- or p$^+$-doped polycrystalline silicon 12 surrounded by the insulating layer 5. In place of the polycrystalline silicon, it is also possible, if appropriate, to use a different correspondingly conducting material. Moreover, the insulating layer 5 may be composed of materials other than silicon dioxide, for example silicon nitride, or alternatively of different insulating films, such as, for example, silicon dioxide and silicon nitride.

These auxiliary electrodes have an effect similar to the p-type zones 4 in the conventional MOSFET of FIG. 4. With the drain voltage $+U_D$ applied to the drain terminal D, the n-type zones 3 are depleted of charge carriers. In the insulating layer 5, a greater field strength of the electric field occurs in this case than in the case of the MOSFET having the conventional structure shown in FIG. 4. However, this does not affect the desired charge carrier depletion.

An advantage of the invention resides in the fact that the MOSFET according to the present invention as shown, for example, in FIG. 1 is considerably simpler to produce than the prior art MOSFET shown in FIG. 4. Trenches 13 may be etched, for example, into the semiconductor body 1 approximately as far as the layer 2 with a width of about 1 to 5 $\mu$m and a depth of about 5 to 40 $\mu$m, whose walls are then covered by, for example, oxidation with the insulating layer 5 made of silicon dioxide and with a layer thickness of from 0.1 to 1 $\mu$m. In this case, the thickness of the insulating layer 5 is not particularly important; rather, in the trenches 13 the thickness can increase from top to bottom or else toward the center.

The trenches 13 are subsequently filled with the polycrystalline silicon 12, which may be p$^+$ or n$^+$-doped. P$^+$-type doping for the auxiliary electrodes 11 is favorable however, since it produces a higher yield with regard to holes possibly present in the insulating layer 5, as explained above.

The arrangement of the auxiliary electrodes 11 need not correspond to the arrangement of the individual semiconductor cells. Rather, the auxiliary electrodes 11 may be provided in the form of pillars, grids or strips or in another configuration.

The n-type zones 3 are preferably doped increasingly highly as the spacing between the auxiliary electrodes is decreased. Care should be taken, however, with auxiliary electrodes 11 running parallel to one another, that the lateral circuit charge of the n-type zones 3 does not exceed twice the dopant quantity corresponding to the breakdown charge.

Instead of the n-type zones 3 (or the semiconductor body 1) it is also possible to provide a plurality of layers having different doping. Furthermore, the n$^+$-doped zone 2 may also be replaced by an n-p$^+$ layer sequence or an n$^+$-p$^+$ layer sequence, as indicated by the dashed line 15 in FIG. 1. An insulated gate bipolar transistor (IGBT) structure results in this case.

Finally, the doping of the polycrystalline silicon 12 of the auxiliary electrodes 11 need not be homogeneous.

FIG. 2 shows a further exemplary embodiment of the invention, in which, in contrast to the exemplary embodiment of FIG. 1, two auxiliary electrodes 11 are assigned to each cell. Of course, it is also possible to provide, if appropriate, three or more auxiliary electrodes 11 for each cell.

Finally, it is also not necessary for the auxiliary electrodes 11 to reach as far as the highly doped n$^+$-doped layer 2 on the side of the drain terminal D. In the same way, it is possible for the auxiliary electrodes 11 to terminate at an n-doped layer 14 provided between the n$^+$-doped layer 2 and the n-type zones 3, as shown in a third exemplary embodiment in FIG. 3.

The invention makes possible, then, a MOSFET which can be produced in a simple manner, using processing steps which are customary when introducing trenches in semiconductor technology, and nevertheless ensures a low on resistance $R_{on}$.

A vertical structure of a MOSFET according to the invention has been described in the above exemplary embodiments. It will be evident to those skilled in the art, however, that the invention can also be applied to a lateral structure in which the auxiliary electrodes 11 extend in the lateral direction in the semiconductor body.

Various preferred embodiments of the invention have now been described. While these embodiments have been set forth by way of example, various other embodiments and modifications will be apparent to those skilled in the art. Accordingly, it should be understood that the invention is not limited to such embodiments, but encompasses all that which is described in the following claims.

What is claimed is:

1. A MOS field-effect transistor, comprising:
   a semiconductor body of a first conductivity type having a first and a second main surface, at least one first semiconductor zone of a second conductivity type opposite to the first conductivity type embedded in the semiconductor body at the first main surface;
   at least one second semiconductor zone of the first conductivity type provided in the at least one first semiconductor zone;
   at least one gate electrode in a region above the at least one first semiconductor zone between the at least one second semiconductor zone and the semiconductor body; and
   a first electrode in contact with the semiconductor body on the second main surface and a second electrode in contact with the at least one second semiconductor zone,
   wherein at least one auxiliary electrode provided with an insulating layer is provided in the semiconductor body, the at least one auxiliary electrode extending in a direction between the first and the second main surfaces of the semiconductor body and being electrically connected to the at least one first semiconductor zone.

2. The MOS field-effect transistor as claimed in claim 1, wherein the at least one auxiliary electrode is provided directly underneath each at least one first semiconductor zone.

3. The MOS field-effect transistor as claimed in claim 1, wherein the at least one auxiliary electrode is configured in a pillar-like structure.

4. The MOS field-effect transistor as claimed in claim 1, wherein the at least one auxiliary electrode reaches as far as a heavily doped layer of the first conductivity type at the second main surface.

5. The MOS field-effect transistor as claimed in claim 1, wherein the at least one auxiliary electrode reaches as far as a weakly doped layer of the first conductivity type provided between the semiconductor body and a heavily doped semiconductor layer of the first conductivity type in contact with the first electrode.

6. The MOS field-effect transistor as claimed in claim 1, wherein the at least one auxiliary electrode comprises highly doped polycrystalline silicon surrounded by an insulating layer made of silicon dioxide.

7. The MOS field-effect transistor as claimed in claim 6, wherein the polycrystalline silicon is not homogeneously doped.

8. The MOS field-effect transistor as claimed in claim 1, wherein the depth of the at least one auxiliary electrode is between about 5 and 40 $\mu$m.

9. The MOS field-effect transistor as claimed in claim 1, wherein the width of the at least one auxiliary electrode is about 1 to 5 $\mu$m.

10. The MOS field-effect transistor as claimed in claim 1, wherein the thickness of the insulating layer is between 0.1 and 1 $\mu$m.

11. The MOS field-effect transistor as claimed in claim 1, wherein the thickness of the insulating layer increases in a direction toward the second main surface.

12. The MOS field-effect transistor as claimed in claim 1, wherein the thickness of the insulating layer increases toward the center of the at least one auxiliary electrode.

13. The MOS field-effect transistor as claimed in claim 1, wherein the at least one auxiliary electrode is produced by etching trenches and filling the trenches with the insulating layer and polycrystalline silicon.

14. The MOS field-effect transistor as claimed in claim 1, wherein a highly doped layer of a third conductivity type or a layer sequence comprising a layer of the third conductivity type and a highly doped layer of a fourth conductivity type opposite to the third conductivity type, or a layer sequence comprising a highly doped layer of the third conductivity type and a highly doped layer of the fourth conductivity type is provided on the semiconductor body at the second main surface.

* * * * *